United States Patent [19]

Takemae et al.

[11] Patent Number: 4,707,811
[45] Date of Patent: Nov. 17, 1987

[54] SEMICONDUCTOR MEMORY DEVICE HAVING EXTENDED PERIOD FOR OUTPUTTING DATA

[75] Inventors: Yoshihiro Takemae, Tokyo; Tomio Nakano; Masao Nakano, both of Kawasaki; Kimiaki Sato, Tokyo, all of Japan

[73] Assignee: Fujitsu Limited, Kawasaki, Japan

[21] Appl. No.: 674,313

[22] Filed: Nov. 23, 1984

[30] Foreign Application Priority Data

Nov. 29, 1983 [JP] Japan .................. 58-223121

[51] Int. Cl.⁴ ............................................. G11C 8/00
[52] U.S. Cl. ................................. 365/239; 365/233
[58] Field of Search .............. 365/230, 233, 189, 219, 365/239, 240, 205; 377/64, 78, 79

[56] References Cited

U.S. PATENT DOCUMENTS

| 4,344,156 | 8/1982 | Eaton, Jr. et al. | 365/189 |
| 4,376,989 | 3/1983 | Takemae | 365/230 |
| 4,602,353 | 7/1986 | Wawersig et al. | 365/189 |

FOREIGN PATENT DOCUMENTS

| 0027477 | 2/1982 | Japan | 365/230 |
| 0062885 | 4/1983 | Japan | 365/230 |
| 0220294 | 12/1983 | Japan | 365/230 |

*Primary Examiner*—Stuart N. Hecker
*Assistant Examiner*—Glenn A. Gossage
*Attorney, Agent, or Firm*—Staas & Halsey

[57] ABSTRACT

A semiconductor memory device has an operational mode such as a nibble mode or page mode, a first address strobe signal is kept in an active state, and a second address strobe signal is successively switched between an active state and standby state, thereby enabling successive data output. Previous output data is reset once, in accordance with the switchover of the second address strobe signal to the active state while the first address strobe signal is in the active state, before outputting data, and the reset operation for outputting is also performed when both the first and second address strobe signals are switched to the standby state, so that the period in which the data is output is expanded.

10 Claims, 7 Drawing Figures

SEMICONDUCTOR MEMORY DEVICE HAVING EXTENDED PERIOD FOR OUTPUTTING DATA

BACKGROUND OF THE INVENTION (1) Field of the Invention

The present invention relates to a semiconductor memory device, more particularly to a semiconductor memory device such as a dynamic random access memory or other device wherein, when an operation is performed by the nibble mode or page mode, the period of the output data can be increased.

(2) Description of the Related Art

In a dynamic random access memory, operation under a nibble mode (4-bit block of a word), page mode, etc. enables a plurality of bits of data to be read out at a high speed. However, when reading out data under the nibble mode, page mode, etc., the time interval of each bit of the read out signal becomes extremely short and the period of the output data becomes considerably short. When the period of the output data is too short, the circuits connected to the memory device cannot respond sufficiently and accurate data readout becomes impossible. Therefore, even in data readout under the nibble mode, page mode, etc., it is desirable that the period of each bit of the output data be made as long as possible.

In a conventional memory device, each successive data readout in the nibble mode or page mode is output after the fall of an inverted column address strobe signal and is reset at the rise of the inverted column address strobe signal. Therefore, the time period of each output data is considerably short.

To eliminate this disadvantage, there is known another memory device, for example, the Model 2716 16K RAM from Intel Co., USA. In this memory device, each output data is reset at the fall of the inverted column strobe signal, thereby considerably expanding the time period of the output data. However, this memory device has the disadvantage of competition occurring between outputs of a plurality of memory chips when a plurality of memory chips are combined to form a large capacity memory system as explained in detail later.

SUMMARY OF THE INVENTION

The object of the present invention, in consideration of the above-mentioned problems in the conventional art, is to provide a semiconductor memory device in which the period of outputting data during the nibble mode, page mode, etc. is expanded and the output data of the memory chips do not compete even in the case of a memory system formed by a plurality of memory chips having common output lines.

According to the present invention, there is provided a semiconductor memory device characterized by being provided with an operational mode wherein, a first address strobe signal is kept in an active state and a second address strobe signal is successively switched between an active state and a standby state, thereby enabling successive data output. Previous data output is reset once in accordance with the switchover of the second address strobe signal to the active state, while the first address strobe signal is in the active state, before outputting data. The reset operation for outputting data is also performed when both the first and second address strobe signals are switched to the standby state.

DESCRIPTION OF THE PREFERRED EMBODIMENTS

Before describing the preferred embodiments, an explanation will be given of a conventional semiconductor memory device employing a nibble mode or page mode.

Figure 1:
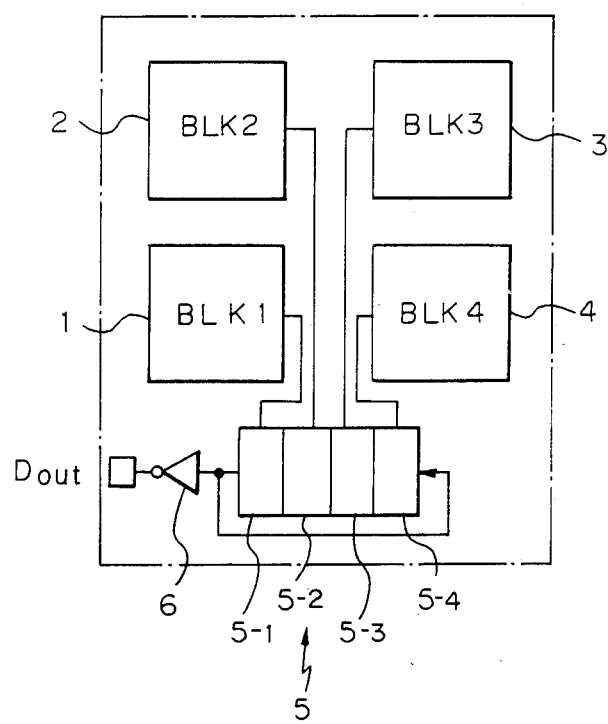
FIG. 1 is a block diagram of a conventional semiconductor memory device.

FIG. 1 is a block diagram of a dynamic random access memory used as a conventional semiconductor memory device. The memory device in the figure is formed by, for example, four cell blocks 1, 2, 3, and 4, each including a plurality of memory cells; data buffers 5-1, 5-2, 5-3, and 5-4 connected to cell blocks 1, 2, 3, and 4, respectively; and an output buffer 6. Each data buffer 5-1, 5-2, ..., and 5-4 is formed by a basic flip-flop type circuit. In the memory device of FIG. 1, data read out from the memory cells in the cell blocks 1, 2, 3, and 4 selected by a raw decoder and column decoder (not shown) are temporarily stored in the data buffers 5-1, 5-2, 5-3, and 5-4, respectively. Next, based on part of the column address signals, i.e., 2 bits in the memory device of FIG. 1, one of the data buffers 5-1, 5-2, 5-3, and 5-4 is selected and 1 bit of data is output through the output buffer 6 as the output data $D_{out}$.

However, in a memory device having the above-mentioned construction, the dynamic random access memories are connected in cascade to form a shift register and it is possible to read out data from the cell blocks 1, 2, 3, 4 at a high speed. This operational mode is called the nibble mode.

Figure 2:
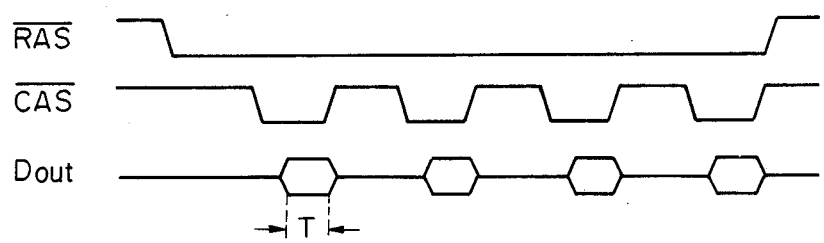
FIG. 2 is a waveform diagram explaining the operation of the memory device of FIG. 1.

In other words, as shown in FIG. 2, during operation under the nibble mode, an inverted row address strobe signal $\overline{RAS}$ becomes low level, the address signal at that time is input and fixed as the row address, and the inverted column address strobe signal $\overline{CAS}$ is then repeatedly turned ON and OFF for successively outputting data from the cell blocks 1, 2, 3, 4.

Therefore, in the operation under the nibble mode, an extremely high speed readout is possible compared with the usual readout operation wherein address selection is performed for both rows and columns for every bit.

However, in the above-mentioned conventional memory device, the output data $D_{out}$ during a nibble mode operation is reset at the rise of the inverted column address strobe signal $\overline{CAS}$, and thus, the data period T of each bit of the output data becomes considerably short and input of the output data $D_{out}$ by the circuits connected to the memory device becomes very difficult. Therefore, this device has the disadvantage of insufficient utilization of the functions of the nibble mode in actual operation. In particular, in recent random access memories, the cycle time for ON-OFF switching of the inverted column address strobe signal $\overline{CAS}$ is short, i.e., 40 to 50 ns. Consequently, in the nibble mode, the effective period T of the output data $D_{out}$ becomes extremely short, i.e., 15 to 20 ns.

As a method of eliminating this disadvantage and of increasing the effective period of the output data, it is known to use a memory device in which the output data reset is performed upon the fall of the inverted column address strobe signal $\overline{CAS}$ (for example, as in Model 2716 16K RAM from Intel Co., USA).

Figure 3:
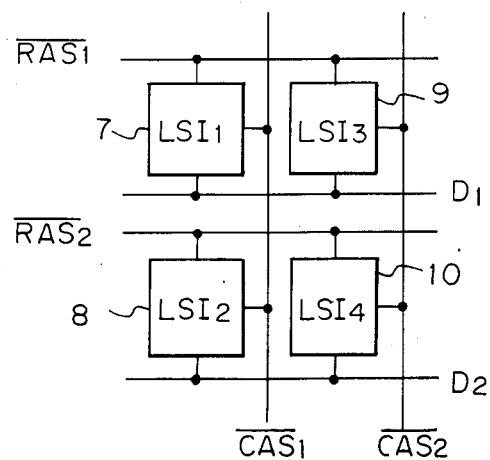
FIG. 3 is a block diagram of a memory system using a plurality of memory chips.

In such a memory device, the period of the output data can be considerably expanded; however, there is the disadvantage of competition between outputs of a plurality of memory chips where a plurality of memory chips 7, 8, 9, and 10 are combined to form a large capacity memory system, as shown in FIG. 3. In other words, in the memory system of FIG. 3, the memory chips 7 and 9 make common use of the output line D1 and a common inverted row address strobe signal $\overline{RAS1}$ is impressed. Also, memory chips 8 and 10 make common use of the output line D2 and a common inverted row address strobe signal $\overline{RAS2}$ is impressed. Further, the memory chips 7 and 8 receive a common inverted column address strobe signal $\overline{CAS1}$ as an input signal, while memory chips 9 and 10 receive a common inverted column address strobe signal $\overline{CAS2}$ as an input signal.

Figure 4:
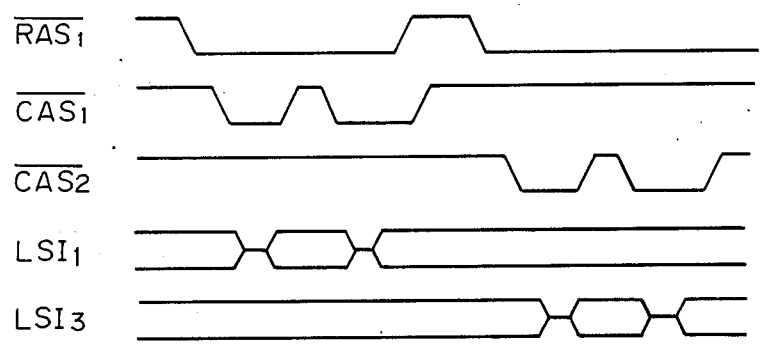
FIG. 4 is a waveform diagram of the operation of the memory system of FIG. 3.

In the memory system shown in FIG. 3, when, for example, successively reading out data from the memory chips 7 and 9, the inverted row address strobe signal $\overline{RAS1}$ becomes low level, then the inverted column address strobe signal $\overline{CAS1}$ repeatedly turns ON and OFF, as shown in FIG. 4. Next, when the readout from the memory chip 7 is completed, the inverted row address strobe signal $\overline{RAS1}$ becomes a high level once, then again becomes a low level, and the inverted column address strobe signal $\overline{CAS2}$ repeatedly turns ON and OFF. By this operation, the output LSI1 from the memory chip 7 and the output LSI3 from the memory chip 9 are successively output on the common data line D1. However, in this case, as is clearly shown in FIG. 4, the output of the memory chip is reset upon the fall of the inverted column address strobe signal, therefore the output LSI1 of the memory chip 7 remains an output even after the completion of the ON-OFF operation of the inverted column address strobe signal $\overline{CAS1}$ and is held until the inverted column address strobe signal $\overline{CAS1}$ next falls. In the same way, the output LSI3 of the memory chip 9 is held until the inverted column address strobe signal $\overline{CAS2}$ falls, therefore the memory chips 7 and 9, which commonly use the output line D1, compete for an output. Consequently, a memory device which resets output data at the fall of the inverted column address strobe signal has a disadvantage in that it cannot be used for a memory system constituted by a plurality of memory chips having common output lines.

The same problem exists with the so-called page mode, wherein, in the state where the row address is fixed, the column address is input at each fall of the inverted column address strobe signal for successive output of data.

The operation of a semiconductor device according to the present invention will be explained with reference to the drawings. The semiconductor memory device of the first embodiment of the present invention has, for example, the constitution of the memory device of FIG. 1 with the output buffer 6 replaced with a below-mentioned (FIG. 7) circuit.

Figure 5:
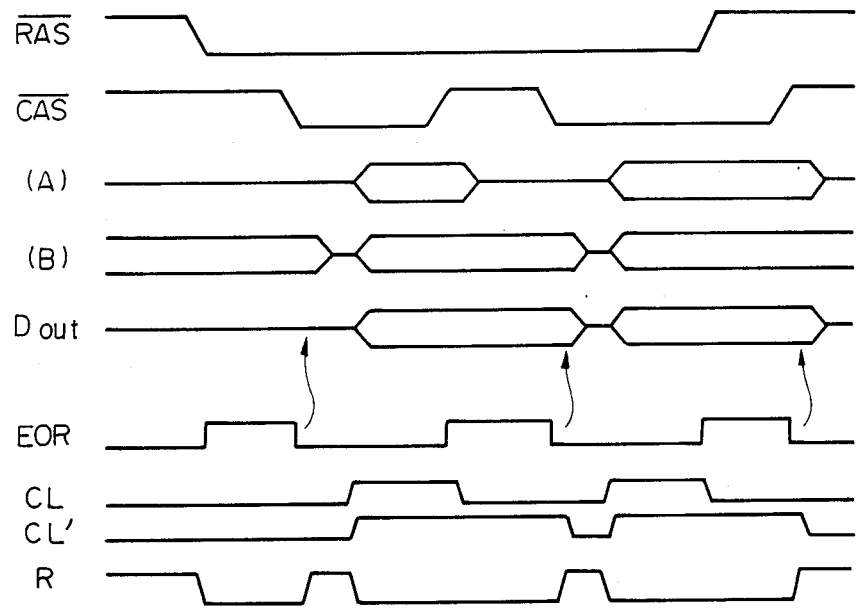
FIG. 5 is a waveform diagram of the operation of a semiconductor memory device according to an embodiment of the present invention.

In a preferred embodiment of the semiconductor memory device of the present invention, during operation under the nibble mode or page mode, the output data is reset based on a signal obtained by an exclusive OR operation of the row address strobe signal and column address strobe signal. In other words, as shown in FIG. 5, after the inverted row address strobe signal $\overline{RAS}$ becomes a low level, and when the inverted column address strobe signal $\overline{CAS}$ once becomes a low level, the output data $D_{out}$ is output after a predetermined time delay after the column address strobe signal $\overline{CAS}$ becomes the low level. The output data $D_{out}$ is reset by the falling edge of a signal EOR obtained by an exclusive OR operation of the row address strobe signal and the column address strobe signal. Consequently, when the inverted column address strobe signal $\overline{CAS}$ again becomes a low level, the previous output data is reset and the output data $D_{out}$ is then output after the above-mentioned predetermined time delay. Subsequently, if the inverted row address strobe signal $\overline{RAS}$ is already at a high level when the inverted column address strobe signal $\overline{CAS}$ once again becomes a high level, the output data $D_{out}$ is reset in response to the rise of the former inverted column address strobe signal $\overline{CAS}$. Therefore, by using this reset method, when the inverted row address strobe signal $\overline{RAS}$ is active, i.e., at a low level, the previous output data $D_{out}$ is reset once at the fall of the inverted column address strobe signal (transition to active state) and then the effective data is output. When the inverted row address strobe signal $\overline{RAS}$ is on standby, i.e., at a high level, the output data is reset at the time the inverted column address strobe signal rises. Therefore, the period for outputting data can be expanded while maintaining interchangeability with conventional dynamic random access memories.

In FIG. 5, waveform A represents the output waveform in a conventional memory device wherein the output signal is reset by the rise of the inverted column address strobe signal $\overline{CAS}$ and waveform B represents the waveform of the output data in a conventional memory device wherein the output data is reset when the inverted column address strobe signal $\overline{CAS}$ falls. An explanation will be given about the signals CL, CL', and R in the description of later embodiments.

Figure 6:
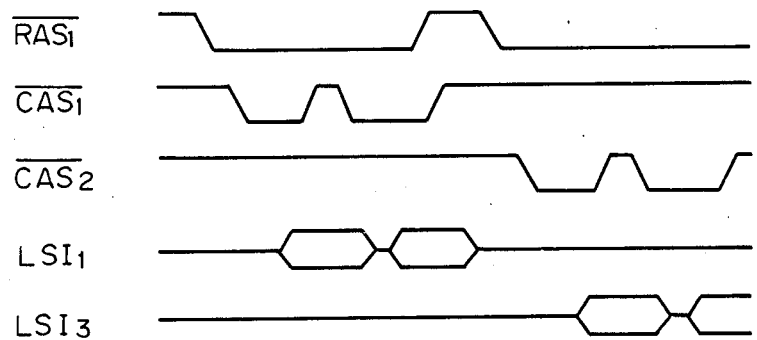
FIG. 6 is a waveform diagram of the operation of a memory system formed by using a plurality of memory chips of the semiconductor memory device according to an embodiment of the present invention.

FIG. 6 is a waveform diagram of the operation of a memory system using a plurality of semiconductor memory devices according to the above-mentioned embodiment of the present invention and formed by the above-mentioned circuit shown in FIG. 3. In FIG. 6, after the inverted row address strobe signal $\overline{RAS1}$ has become a low level, the inverted column address strobe signal $\overline{CAS1}$ repeatedly turns ON and OFF. The output LSI1 of the memory chip 7 at this time, as shown in FIG. 6, is not output after the inverted row address strobe signal $\overline{RAS1}$ becomes a high level and the inverted column address strobe signal $\overline{CAS1}$ becomes a high level. Further, even when the inverted column address strobe signal $\overline{CAS2}$ repeatedly turns ON and OFF, the output LSI3 of the memory chip 9 is not output before the time that the inverted column address strobe signal $\overline{CAS2}$ initially becomes a low level. Therefore, the outputs of the two memory chips 7 and 9, making common use of the output line D1, do not compete.

Figure 7:
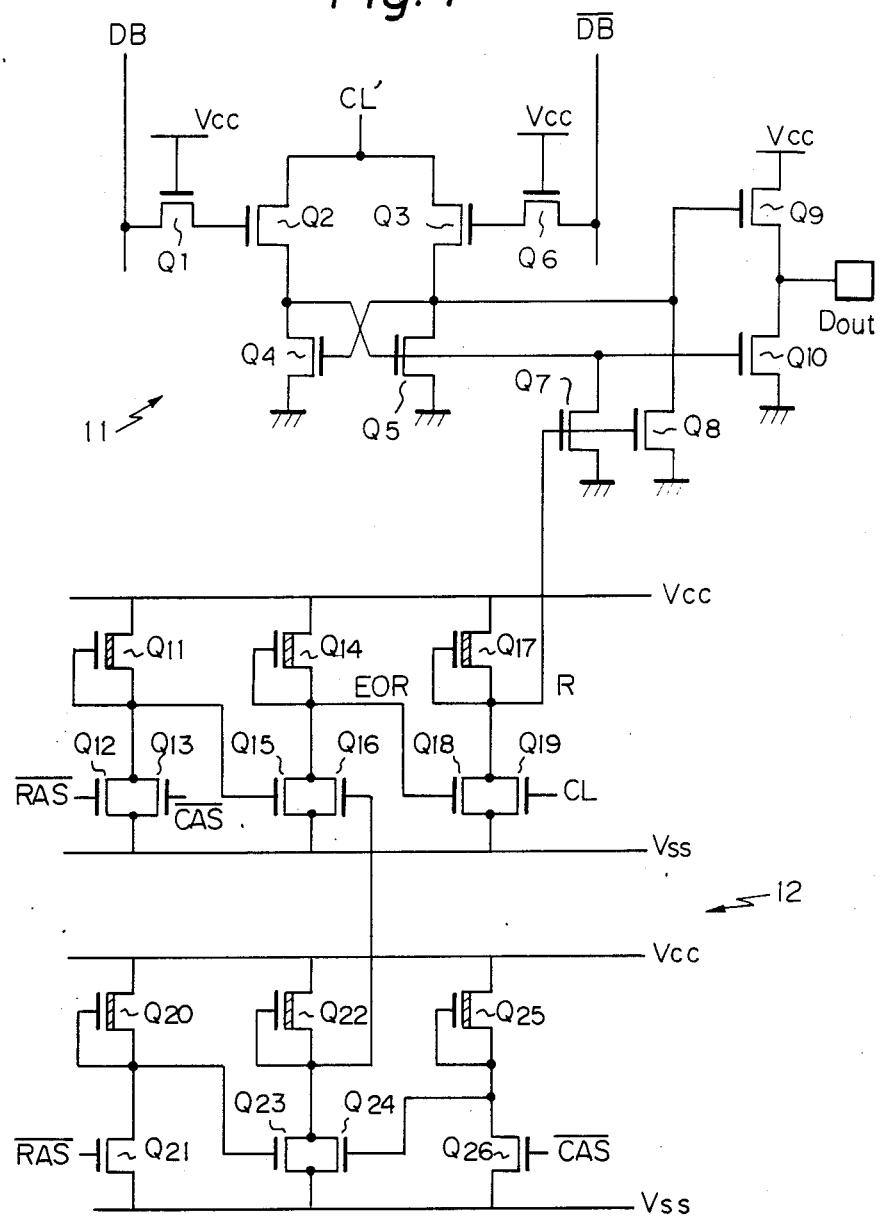
FIG. 7 is an electrical circuit diagram of an output buffer used in the semiconductor memory device according to the embodiment of the present invention.

FIG. 7 is a detailed description of an output buffer used in the semiconductor memory device according to an embodiment of the present invention. The output buffer of FIG. 7 is provided with a buffer portion 11 formed of transistors Q1 to Q10, etc. and a reset signal generating circuit portion 12 formed of transistors Q11 to Q26, etc.

In the output buffer shown in FIG. 7, the data buses DB and $\overline{DB}$ of the buffer portion 11 are connected to the outputs of the shift registers formed by the data buffers of each cell block (not shown) for a semiconductor memory device with a nibble mode function. When the clock pulse CL' is at a high level, the outputs of the data buffers DB and $\overline{DB}$ are impressed upon the gates of the transistors Q2 and Q3 through the transistors Q1 and Q6, respectively. The clock signal CL' rises and becomes a high level following a predetermined time delay, after which outputting data is possible. The data is output after the inverted column address strobe signal $\overline{CAS}$ falls and when the inverted row address strobe signal $\overline{RAS}$ is in the active state (low level), and after the inverted column address strobe signal $\overline{CAS}$ becomes a high level, maintaining the high level in a floating state. Referring to FIG. 5, the clock signal CL becomes a high level when the two strobe signals $\overline{RAS}$ and $\overline{CAS}$ enter the active state and data output is possible in the readout state. This is an internal clock signal which is used also for the conventional device (output of waveform A in FIG. 5) and which falls in accordance with the rise of ($\overline{CAS}$). The above clock signal CL' is similar to the clock signal CL. However after the rise of the inverted column address strobe signal $\overline{CAS}$, the high level is held at the floating level and then becomes the low state only after the reset operation of the buffer circuit 11 (explained below). Then, for example, if the data bus DB is a high level and the data bus $\overline{DB}$ is a low level, the clock signal CL' becomes the high level and, thereby, the transistor Q5 becomes on and the transistor Q4 becomes off. Thus, the gate of the transistor Q9 of the output circuit becomes a low level and the transistor Q9 is cut off, the gate of the transistor Q10 becomes a high level, and the transistor Q10 becomes ON. Therefore, for example, a low level signal is output as the output data $D_{out}$. Even if the clock signal CL' is in the floating state, this output state is maintained as long as the clock signal CL' is held at a high level.

However, in the reset signal generating circuit 12, when the inverted row address strobe signal $\overline{RAS}$ and the inverted column address strobe signal $\overline{CAS}$ are both at a high level, the transistors Q21 and Q26 both become ON and the gate voltages of the transistor Q23 and Q24 both become a low level. Consequently, transistors Q23 and Q24 are both cut off, and therefore, the gate of the transistor Q16 becomes a high level. The transistor Q16 becomes ON, the exclusive OR output (EOR) of the two strobe signals becomes a low level, and the transistor Q18 becomes cut off. If, in this state, the clock pulse CL is a low level, and the reset signal output R becomes a high level. Further, when the inverted row address strobe signal $\overline{RAS}$ and the inverted column address strobe signal $\overline{CAS}$ are both a low level, the transistors Q12 and Q13 are both cut off and the gate voltage of the transistor Q15 becomes high. Consequently, the transistor Q15 becomes ON and the EOR signal output terminal, i.e., the gate voltage of the transistor Q18, is pulled down to a low level and the transistor Q18 is cut off. Therefore, in this case too, if the clock pulse CL is a low level, the reset signal output R is a high level. On the other hand, if one of the inverted row address strobe signal $\overline{RAS}$ and the inverted column address strobe signal $\overline{CAS}$ is a high level and the other is a low level, the gate voltages of the transistors Q15 and Q16 both become a low level and the transistors Q15 and Q16 are both cut off. Consequently, the inverted exclusive OR output EOR is a high level, the transistor Q18 turns ON, and the output R becomes a low level. As is clear from the above, the reset signal generating circuit 12 of FIG. 7 includes a portion for operating as an exclusive NOR circuit for the signals $\overline{RAS}$ and $\overline{CAS}$. The reset signal generating circuit 12 outputs a reset signal R at times other than times prescribed by the clock signal CL, which is a high level after the output data becomes effective, while the two strobe signals $\overline{RAS}$ and $\overline{CAS}$ are in the active state and while the EOR output is a high level.

When the output R of the above-mentioned reset signal generating circuit 12 is a high level, the transistors Q7 and Q8 of the buffer portion 11 both become ON. Therefore, the gates of the series connected output transistors Q9 and Q10 both become a low level and enter the cutoff state, and the output terminal enters the high impedance state. In other words, by changing the output buffer circuit in FIG. 7 with the output buffer 6 of the memory device in FIG. 1, the information incorporated from the data buffer, at the time the clock pulse CL temporarily becomes a high level, to the flip-flop circuit, formed by transistors Q4 and Q5, is reset at the time when the reset signal R rises. At the same time, the clock signal CL' drops from the floating high level state to a low level and the output terminal is then in a high impedance state. In the circuit of FIG. 7, the transistor Q19, provided at the output stage of the reset signal generating circuit 12, prevents the output data of the buffer portion 11 from being reset when the clock pulse CL becomes a high level.

In this way, according to the present invention, during operation under the nibble mode or page mode, resetting of the output data is effected based on the signals obtained by exclusive OR operations of the row address strobe signal and the column address strobe signal. Therefore, the period of the output data can be made sufficiently long, and also, no competition occurs between output data in a memory system formed by a plurality of memory chips having common output lines.

We claim:

1. A semiconductor memory device for storing data, operative in response to first and second address strobe signals, respectively, having a standby state and an active state, comprising:

output means for outputting an output signal corresponding to data stored in the memory device in response to a switchover of the first and second address strobe signals from the standby state to the active state, said output means capable of retaining the output signal; and resetting means, operatively connected to said output means, for resetting the output signal retained by said output means in response to the switchover of the second address strobe signal from the standby state to the active state while the first address strobe signal is maintained in the active state, said resetting means also resetting the output signal when both the first and second address strobe signals are in the standby state.

2. A semiconductor memory device according to claim 1, further comprising:

a plurality of memory cell blocks, operatively connected to said resetting means, having data stored therein;

a shift register, operatively connected to said plurality of memory cell blocks, for receiving the data from said memory cell blocks and outputting the output signal; and an output buffer circuit, operatively connected to said shift register, for receiving the output signal from said shift register after the output data is reset by said resetting means.

3. A semiconductor memory device according to claim 2, wherein said output buffer comprises:

a flip-flop circuit, operatively connected to said shift register, for receiving the output signal from said shift register and providing complementary output signals;

an output amplifier circuit, operatively connected to said flip-flop circuit, for receiving and amplifying the output signals from said flip-flop circuit; and a reset circuit, operatively connected to said flip-flop circuit, for resetting the complementary output signals from said flip-flop circuit.

4. A semiconductor memory device according to claim 3, wherein said output amplifier includes a pair of transistors connected in series, operatively connected to said flip-flop circuit, for respectively receiving the complementary output signals from said flip-flop circuit.

5. A semiconductor memory device according to claim 4, wherein said flip-flop circuit includes cross-connected transistors, and wherein said reset circuit comprises a pair of transistors, each respectively connected in parallel to one of said cross-connected transistors of said flip-flop circuit, said pair of transistors of said reset circuit turning on and resetting the complementary output signals of said flip-flop circuit in accordance with the output signal from said resetting means.

6. A semiconductor memory device according to claim 1, wherein said resetting means includes an exclusive OR circuit, operatively connected to receive the first and second address strobe signals, for providing an output signal for resetting the output data.

7. A semiconductor device according to claim 6, wherein said semiconductor memory device further comprises:

a plurality of memory cell blocks having readout data stored therein;

a shift register, operatively connected to said memory cell blocks, for receiving readout data in parallel from said memory cell blocks, and outputting a signal; and an output buffer circuit, operatively connected to said shift register, for receiving the output signal from said shift register after resetting the previous output data in accordance with the output signal from said exclusive OR circuit.

8. A semiconductor memory device according to claim 7, wherein said output buffer comprises:

a flip-flop circuit, operatively connected to said shift register, for receiving the output signal from said shift register and providing an output;

an output amplifier circuit, operatively connected to said flip-flop circuit, for receiving the output from said flip-flop circuit; and a reset circuit, operatively connected to said flip-flop circuit, for resetting the output from said flip-flop circuit.

9. A semiconductor memory device according to claim 8, wherein said output amplifier circuit comprises a pair of transistors connected in series, each respectively receiving complementary output signals from said flip-flop circuit.

10. A semiconductor memory device according to claim 9, wherein said flip-flop circuit is constructed of cross-connected transistors, and wherein said reset circuit comprises a pair of transistors, each respectively connected in parallel to one of said cross-connected transistors forming said flip-flop circuit, and which are turned on to reset the output of said flip-flop circuit in accordance with the output signal of said exclusive OR circuit.

* * * * *